(12) United States Patent
Suzuki et al.

(10) Patent No.: US 7,280,163 B2
(45) Date of Patent: Oct. 9, 2007

(54) DIRECT CONVERSION TUNER CAPABLE OF RECEIVING DIGITAL TELEVISION SIGNALS IN UHF BAND AND VHF BAND

(75) Inventors: Takeo Suzuki, Fukushima-ken (JP); Kimihiro Nakao, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 504 days.

(21) Appl. No.: 10/909,472

(22) Filed: Aug. 2, 2004

(65) Prior Publication Data

US 2005/0030433 A1  Feb. 10, 2005

(30) Foreign Application Priority Data

Aug. 8, 2003  (JP) .............. 2003-290951

(51) Int. Cl.
  *H04N 5/44*  (2006.01)
(52) U.S. Cl. .................................... 348/731
(58) Field of Classification Search ........... 348/731, 348/726, 552; 455/313, 319, 321, 196, 13.02, 455/296; 375/350, 332, 316
See application file for complete search history.

(56) References Cited

U.S. PATENT DOCUMENTS

| | | | | |
|---|---|---|---|---|
| 5,584,068 A * | 12/1996 | Mohindra | ............. | 455/324 |
| 5,999,802 A * | 12/1999 | Aschwanden | ............. | 455/196.1 |
| 6,031,878 A * | 2/2000 | Tomasz et al. | ............. | 375/316 |
| 6,559,899 B1 * | 5/2003 | Suzuki et al. | ............. | 348/731 |
| 6,577,855 B1 * | 6/2003 | Moore et al. | ............. | 455/324 |
| 6,731,923 B2 * | 5/2004 | Atkinson | ............. | 455/323 |
| 7,002,639 B2 * | 2/2006 | Kawai | ............. | 348/731 |
| 7,050,778 B1 * | 5/2006 | Olson | ............. | 455/296 |
| 2002/0171458 A1 | 11/2002 | Hirano | | |

FOREIGN PATENT DOCUMENTS

| | | |
|---|---|---|
| EP | 1 195 899 | 4/2002 |
| JP | 11-331011 | 11/1999 |
| JP | 2003-264523 | 9/2003 |

OTHER PUBLICATIONS

Aschwanden Felix: "Direct Conversion—How To Make It Work In TV Tuners" IEEE Transactions on Consumer Electronics, IEEE Inc., vol. 32, No. 3. Aug. 1996, pp. 729-738, XP000638561 New York, US.
Search Report dated Nov. 30, 2004 for European Patent Application No. EP 04 01 8697.

* cited by examiner

*Primary Examiner*—Paulos M. Natnael
(74) *Attorney, Agent, or Firm*—Brinks Hofer Gilson & Lione

(57) ABSTRACT

A direct conversion tuner includes mixers that orthogonally convert a digital television signal located in high channels of the VHF band and a digital television signal located in a frequency range of 470 MHz to 608 MHz in the UHF band directly into baseband signals, and an oscillator that supplies local oscillation signals to the mixers. The oscillator is caused to oscillate at a frequency that is sixfold a frequency in the high channels of the VHF band or a frequency that is twofold a frequency in the frequency range of 470 MHz to 608 MHz in the UHF band. An oscillation signal having the twofold frequency is divided by two and an oscillation signal having the sixfold frequency is divided by six to generate local oscillation signals having orthogonal phases for both of these oscillation signals. The local oscillation signals having the divided frequencies are supplied to the mixers.

4 Claims, 4 Drawing Sheets

DIRECT CONVERSION TUNER CAPABLE OF RECEIVING DIGITAL TELEVISION SIGNALS IN UHF BAND AND VHF BAND

This application claims the benefit of priority to Japanese Patent Application No. 2003-290951, herein incorporated by reference.

BACKGROUND OF THE INVENTION

1. Field of the Invention

The present invention relates to a direct conversion tuner that includes two mixers and that outputs an I signal and a Q signal having orthogonal phases.

2. Description of the Related Art

A conventional direct conversion tuner will be described with reference to FIG. 7. For example, a digitally modulated high-frequency signal is received by a receiving unit 41 including a bandpass filter 42 and a low-noise amplifier 43 provided at a next stage, and is then distributed into two by a distributing circuit 44. The distributed high-frequency signals are input to a first mixer 45 and a second mixer 46. The first mixer 45 and the second mixer 46 receive local oscillation signals from an oscillation circuit 47. The first mixer 45 receives a local oscillation signal directly, while the second mixer 46 receives a local oscillation signal via a 90° phase shifter 48. Thus, the local oscillation signals supplied to the two mixers 45 and 46 have a phase difference of 90°. The local oscillation frequency coincides with, for example, the frequency of the high-frequency signal received.

Thus, the two mixers 45 and 46 output baseband signals, and an I signal output from the first mixer 45 and a Q signal output from the second mixer 46 have a phase difference of 90°. In order to avoid image interference, these baseband signals are output to subsequent stages via bandpass filters 49 and 50, respectively. This scheme is described, for example, in Japanese Unexamined Patent Application Publication No. 11-331011 (FIG. 11).

The baseband signals having passed through the bandpass filters 49 and 50 are added together by an adder circuit that is not shown, and then the resulting signal is demodulated.

When television signals in the UHF band and the VHF band are to be received using the direct conversion tuner described above, since the frequencies of these bands are separated from each other, two independent oscillators respectively for the UHF band and the VHF band are needed in an oscillation circuit. Furthermore, two PLL circuits for controlling oscillation frequencies, associated with the respective oscillators, are needed. Therefore, the overall construction becomes complex.

SUMMARY OF THE INVENTION

It is an object of the present invention to provide a direct conversion tuner that is capable of receiving both digital television signals in the UHF band and digital television signals in the VHF band using a single oscillator.

In order to achieve the above object, the present invention provides a direct conversion tuner including mixers that orthogonally convert a digital television signal located in high channels of the VHF band and a digital television signal located in a frequency range of 470 MHz to 608 MHz in the UHF band directly into baseband signals, and an oscillator that supplies local oscillation signals to the mixers, wherein the oscillator is caused to oscillate at a frequency that is sixfold a frequency in the high channels of the VHF band or a frequency that is twofold a frequency in the frequency range of 470 MHz to 608 MHz in the UHF band, wherein an oscillation signal having the twofold frequency is divided by two and an oscillation signal having the sixfold frequency is divided by six to generate local oscillation signals having orthogonal phases for both of these oscillation signals, and wherein the local oscillation signals having the divided frequencies are supplied to the mixers.

Preferably, a first frequency divider that divides the oscillation signal having the sixfold frequency by three and that outputs a divided-frequency signal having a duty ratio of 50%, and a second frequency divider that performs divide-by-two frequency division and that outputs two divided-frequency signals having a phase difference of 90° are provided, and the divided-frequency signal of the first frequency divider or the oscillation signal having the twofold frequency is input to the second frequency divider.

More preferably, the first frequency divider is formed by first and second master-slave flip-flop circuits connected in series with each other and a logic OR circuit connected to an output of a master flip-flop circuit and an output of a slave flip-flop circuit in the first or second master-slave flip-flop circuit, and the second frequency divider is formed by a Johnson-counter 90° phase shifter including a third master-slave flip-flop circuit.

Furthermore, for example, a splitter that separates the digital television signal in the VHF band and the digital television signal in the UHF band is provided, and the mixers are connected to one output terminal and the other output terminal of the splitter, respectively.

Alternatively, for example, a splitter that separates the digital television signal in the VHF band and the digital television signal in the UHF band, and a switching circuit connected at a subsequent stage of the splitter are provided, and the mixers are connected to the switching circuit.

According to the present invention, mixers that orthogonally convert a digital television signal located in high channels of the VHF band and a digital television signal located in a frequency range of 470 MHz to 608 MHz in the UHF band directly into baseband signals, and an oscillator that supplies local oscillation signals to the mixers are provided, the oscillator is caused to oscillate at a frequency that is sixfold a frequency in the high channels of the VHF band or a frequency that is twofold a frequency in the frequency range of 470 MHz to 608 MHz in the UHF band, an oscillation signal having the twofold frequency is divided by two and an oscillation signal having the sixfold frequency is divided by six to generate local oscillation signals having orthogonal phases for both, and the local oscillation signals having the divided frequencies are supplied to the mixers. Thus, the oscillation frequencies of the oscillator for reception in the UHF band and reception in the VHF band are close to each other. Accordingly, a common oscillator can be used, and a narrow oscillation frequency range suffices.

Furthermore, preferably, a first frequency divider that divides the oscillation signal having the sixfold frequency by three and that outputs a divided-frequency signal having a duty ratio of 50%, and a second frequency divider that performs divide-by-two frequency division and that outputs two divided-frequency signals having a phase difference of 90° are provided, and the divided-frequency signal of the first frequency divider or the oscillation signal having the twofold frequency is input to the second frequency divider. Accordingly, local oscillation signals having orthogonal phases can be readily obtained both for reception in the UHF band and reception in the VHF band.

Furthermore, more preferably, the first frequency divider is formed by first and second master-slave flip-flop circuits connected in series with each other and a logic OR circuit connected to an output of a master flip-flop circuit and an output of a slave flip-flop circuit in the first or second master-slave flip-flop circuit, and the second frequency divider is formed by a Johnson-counter 90° phase shifter including a third master-slave flip-flop circuit. Accordingly, a divided-frequency signal having a duty ratio of 50% is obtained by the first frequency divided even when frequency changes, and local oscillation signals having orthogonal phases are obtained by the second frequency divider both for reception in the UHF band and reception in the VHF band.

Furthermore, for example, a splitter that separates the digital television signal in the VHF band and the digital television signal in the UHF band is provided, and the mixers are connected to one output terminal and the other output terminal of the splitter, respectively. Accordingly, the mixers can be implemented by circuits compatible with the UHF band and the VHF band.

Alternatively, for example, a splitter that separates the digital television signal in the VHF band and the digital television signal in the UHF band, and a switching circuit connected at a subsequent stage of the splitter are provided, and the mixers are connected to the switching circuit. Accordingly, stages subsequent to the mixers can be implemented by a single line.

DESCRIPTION OF THE PREFERRED
EMBODIMENTS

Figure 1:
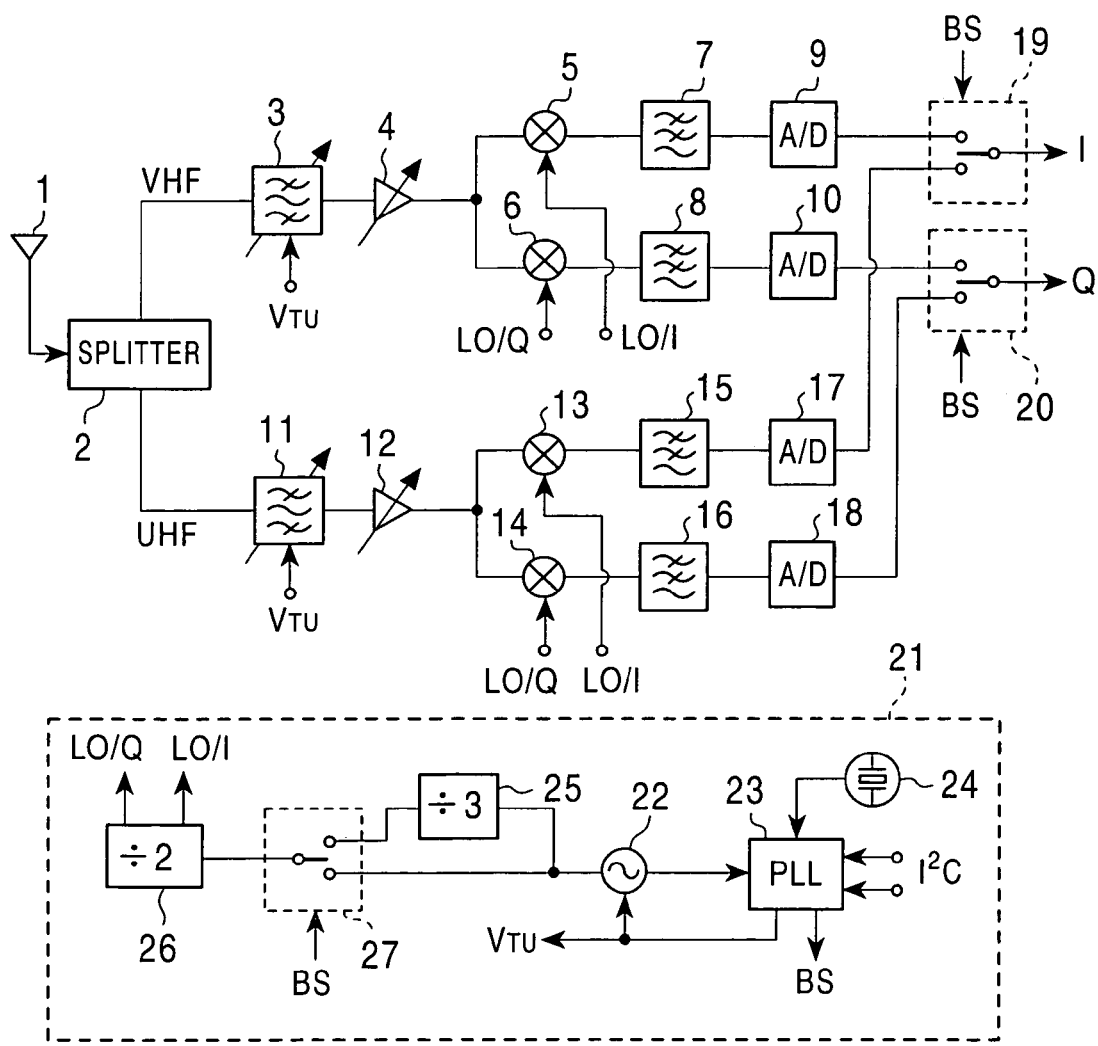
FIG. 1 is a circuit diagram showing the construction of a direct conversion tuner according to an embodiment of the present invention.

Now, the construction of a direct conversion tuner according to an embodiment of the present invention will be described with reference to FIG. 1. A digital television signal in the VHF band (referred to as a VHF signal) and a digital television signal in the UHF band (referred to as a UHF signal), received by an antenna 1, are separated by a splitter 2, and the VHF signal is filtered by a VHF bandpass filter 3. The VHF bandpass filter 3 is implemented by a multiple-tuned circuit, and the tuned frequencies thereof can be changed according to a tuning voltage $V_{TU}$. An output signal of the VHF bandpass filter 3 is input to a subsequent VHF amplifier 4. The VHF amplifier 4 is implemented by a variable-gain amplifier, and an output thereof is amplified to a constant level and is then input to two mixers 5 and 6 provided at a subsequent stage.

The mixers 5 and 6 respectively receive local oscillation signals LO/I and LO/Q having orthogonal phases (i.e., different by 90°) from a local oscillation unit 21, the local oscillation signals having the same frequency as the VHF signals. Thus, the VHF signals input to the mixers 5 and 6 are orthogonally transformed to output baseband signals having orthogonal phases (I signal and Q signal). The baseband signals are converted into digital signals by analog/digital converters (referred to as A/D converters) 9 and 10 via IF bandpass filters 7 and 8, respectively.

Similarly, the UHF signal separated by the splitter 2 is filtered by a UHF bandpass filter 11. The UHF bandpass filter 11 is also implemented by a multiple-tuned circuit, and the tuned frequencies thereof can be changed according to a tuning voltage $V_{TU}$. An output signal of the UHF bandpass filter 11 is input to a subsequent UHF amplifier 12. The UHF amplifier 12 is also implemented by a variable-gain amplifier, and an output thereof is amplified to a constant level and is then input to two mixers 13 and 14.

The mixers 13 and 14 respectively receive local oscillation signals LO/I and LO/Q having orthogonal phases (i.e., different by 90°) from the local oscillation unit 21, the local oscillation signals having the same frequency as the UHF signals. Thus, the UHF signals input to the mixers 13 and 14 are orthogonally transformed to output baseband signals having orthogonal phases (I signal and Q signal). The baseband signals are converted into digital signals by A/D converters 17 and 18 via IF bandpass filters 15 and 16, respectively.

The I signal output from the A/D converter 9 (based on the VHF signal) and the I signal output from the A/D converter 17 (based on the UHF signal) are input to a first switching circuit 19. The Q signal output from the A/D converter 10 (based on the VHF signal) and the Q signal output from the A/D converter 18 (based on the UHF signal) are input to a second switching circuit 20. The first and second switching circuits 19 and 20 operate in cooperation with each other according to a band switching signal BS output from the local oscillation unit 21 so that either the I signal and Q signal based on the VHF signals or the I signal and Q signal based on the UHF signals will be output.

The local oscillation unit 21 includes an oscillator 22 implemented by a voltage-controlled oscillator, a PLL circuit 23 that controls the oscillation frequency of the oscillator 22, a reference oscillator 24 that supplies a reference signal to the PLL circuit 23, a first frequency divider that divides the frequency of an oscillation signal output from the oscillator 22 by three, a second frequency divider 26 that divides the frequency-division output of the first frequency divider 25 and the oscillation signal output from the oscillator 22, and a third switching circuit 27 that selectively inputs either the frequency-division output of the first frequency divider 25 or the oscillation signal output from the oscillator 22 to the second frequency divider 26.

The PLL circuit 23 receives frequency data of a channel to be received by an I²C bus, and the PLL circuit 23 outputs a tuning voltage $V_{TU}$ and a band switching signal BS based on the frequency data. The tuning voltage $V_{TU}$ is supplied to the VHF bandpass filter 3 and the UHF bandpass filter 11. The VHF bandpass filter 3 and the UHF bandpass filter 11 tune to the channel to be received or to a specific segment in the channel, and the oscillator 22 oscillates at a frequency of the channel or segment.

The band switching signal BS is input to the first to third switching circuits to switch between reception of a VHF signal and reception of a UHF signal.

The frequency ranges of local oscillation signals needed for the mixers 5, 6, 13, and 14 must be the same as frequency ranges of VHF signals and UHF signals to be received. Thus, the frequency range for receiving VHF signals is 173 MHz to 219 MHz, and the frequency range for receiving UHF signals is 473 MHz to 605 MHz.

The oscillator 22 is controlled by the PLL circuit 23 to oscillate at a frequency that is sixfold a receiving frequency when a VHF signal is to be received, i.e., in a range of 1,038 MHz to 1,314 MHz, and so as to oscillate at a frequency that is twofold a receiving frequency when a UHF signal is to be received, i.e., in a range of 946 MHz to 1,210 MHz. Thus, the overall oscillation frequency range of the oscillator 22 is 946 MHz to 1,314 MHz. Since the ratio of the highest frequency to the lowest frequency is about 1.4, the entire oscillation frequency range can be covered by a single oscillator.

Figure 2:
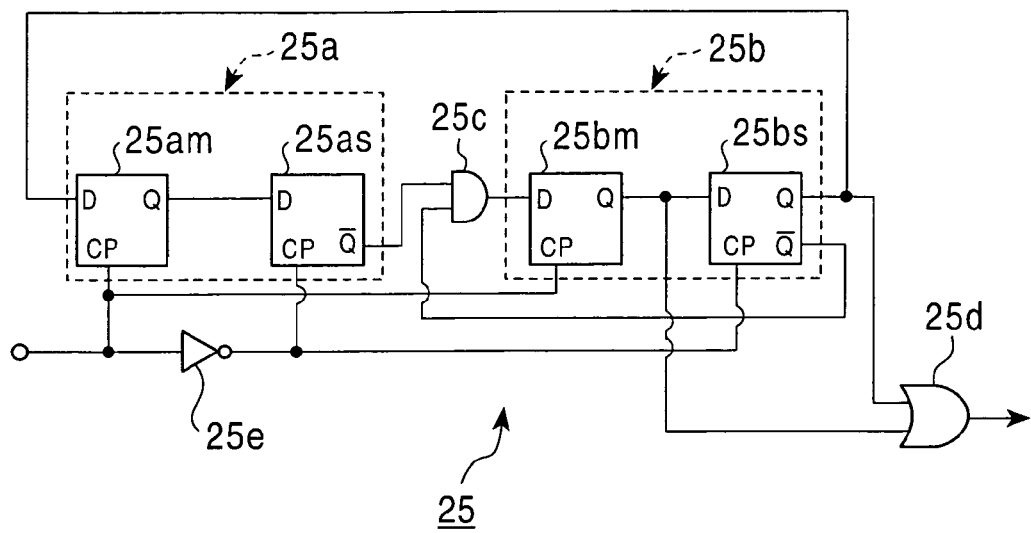
FIG. 2 is a circuit diagram of a first frequency divider used in the direct conversion tuner according to the embodiment.

The oscillation signal having the sixfold frequency is input to the first frequency divider 25, and the oscillation signal having the twofold frequency is input to the third switching circuit 27. As shown in FIG. 2, the first frequency divider 25 includes a first master-slave flip-flop circuit (a flip-flop circuit will hereinafter be referred to as an F/F circuit) 25a and a second master-slave F/F circuit 25b that are connected in series with each other, an AND circuit 25c that takes the logical AND of a Q output of a slave F/F circuit 25as in the first master-slave F/F circuit 25a and a Q output of a slave F/F circuit 25bs in the second master-slave F/F circuit 25b and that inputs the result to a master F/F circuit 25bm in the second master-slave F/F circuit 25b, the AND circuit 25c being provided between the first and second master-slave F/F circuits 25a and 25b, and an OR circuit 25d that takes the logical OR of a Q output of the master F/F circuit 25bm and the Q output of the slave F/F circuit 25bs in the second master-slave F/F circuit 25b. These F/F circuits 25am, 25as, 25bm, and 25bs are implemented by D F/F circuits, but can also be implemented by other F/F circuits such as JK F/F circuits.

The master F/F circuit 25am in the first master-slave F/F circuit 25a and the master F/F circuit 25bm in the second master-slave F/F circuit 25b receive oscillation signals from the oscillator 22 as clock signals. On the other hand, the slave F/F circuit 25as in the first master-slave F/F circuit 25a and the slave F/F circuit 25bs in the second master-slave F/F circuit 25b receive clock signals inverted by the inverter 25e.

Figure 3:
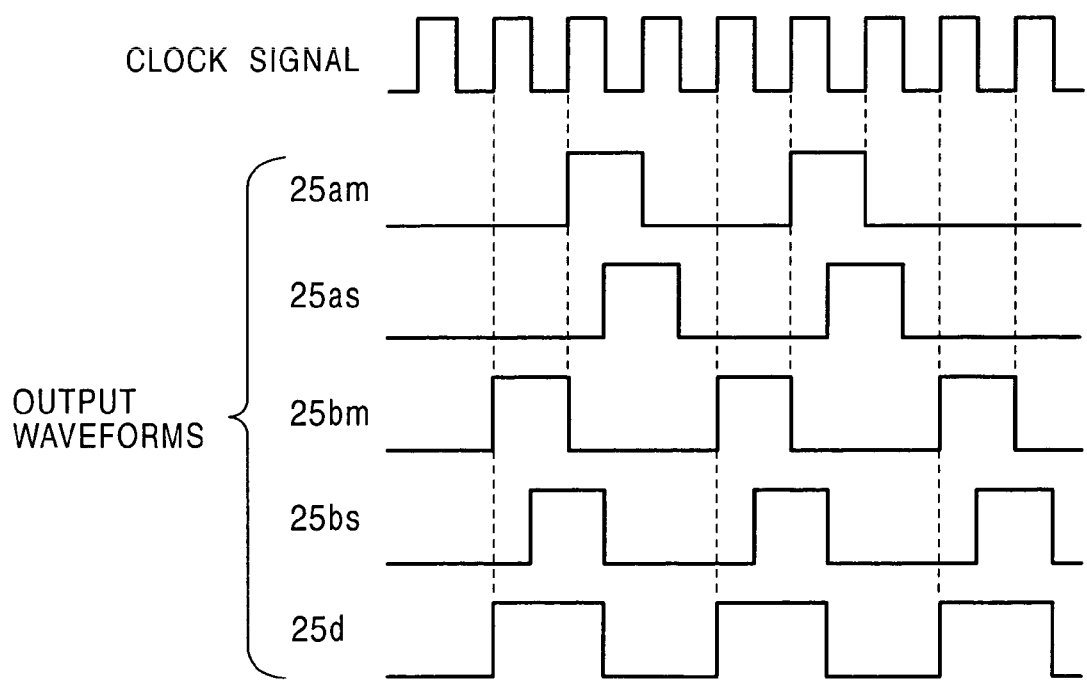
FIG. 3 is a diagram for explaining an operation of the first frequency divider used in the direct conversion tuner according to the embodiment.

In the arrangement described above, a divide-by-three frequency divider is formed by the two master-slave F/F circuits 25a and 25b, the AND circuit 25c, and the inverter 25e. As will be understood from FIG. 3 showing a clock signal and respective output waveforms of the F/F circuits 25am, 25as, 25bm, and 25bs, and the OR circuit 25d, the F/F circuits 25am, 25as, 25bm, and 25bs output divided-frequency signals having a duty ratio of 1/3. The OR gate 25d outputs a divided-frequency signal having a duty ratio of 1/2. The OR gate 25d may be connected to a Q output of the master F/F circuit 25am and a Q output of the slave F/F circuit 25as in the first master-slave F/F circuit 25a.

Figure 4:
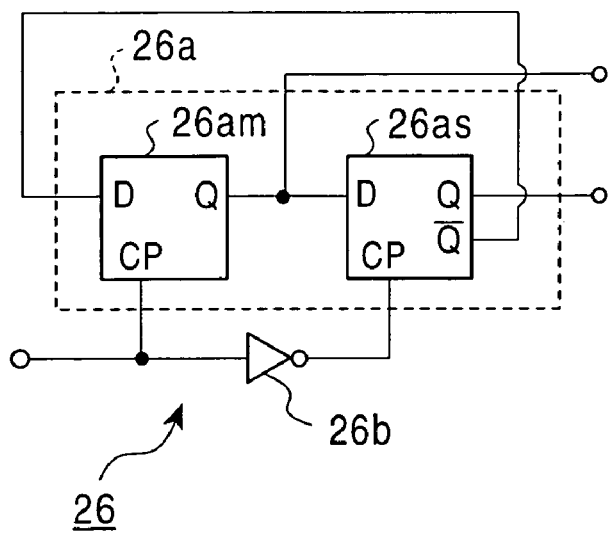
FIG. 4 is a circuit diagram of a second frequency divider used in the direct conversion tuner according to the embodiment.
Figure 5:
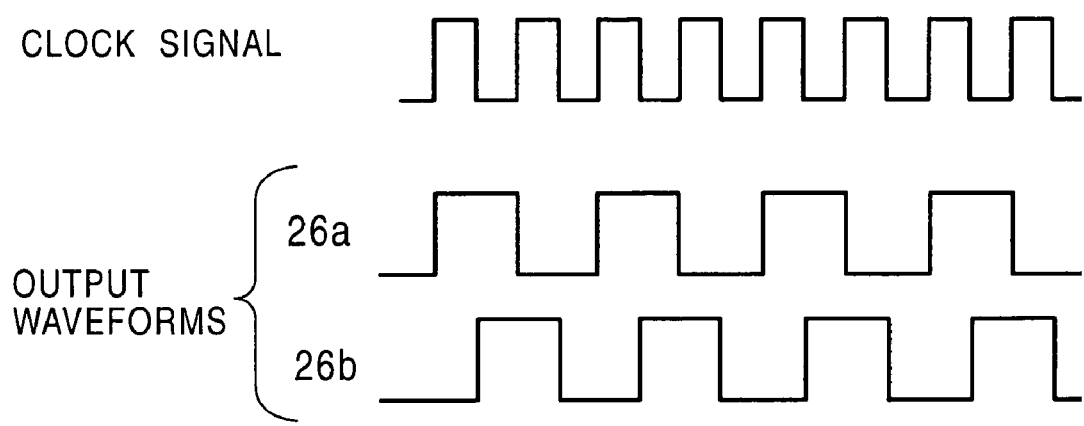
FIG. 5 is a diagram for explaining an operation of the second frequency divider used in the direct conversion tuner according to the embodiment.

As shown in FIG. 4, the second frequency divider 26 is formed by a third master-slave F/F circuit 26a and an inverter 26b. A master F/F circuit 26am and a slave F/F circuit 26as receive clock signals, the slave F/F circuit 26as receiving a clock signal via the inverter 26b. The second frequency divider 26 is referred to as a Johnson counter, and a Q output of the slave F/F circuit 26as is delayed in phase by 90° than a Q output of the master F/F circuit 26am when the duty ratio of the clock signal is 50%, as in the operation waveforms shown in FIG. 5. The second frequency divider 26 can also be implemented by other circuits such as a JK F/F circuit.

Thus, when a VHF signal is to be received, the third switching circuit 27 connects the second frequency divider 26 to the first frequency divider 25, so that an oscillation signal between 1,038 MHz to 1,314 MHz, output from the oscillator 22, is divided by six by the first frequency divider 25 and the second frequency divider 26 to 173 MHz to 219 MHz. In this case, a divided-by-three frequency signal having a duty ratio of 50% is input from the first frequency divider 25. Thus, the master F/F circuit 26am and the slave F/F circuit 26as of the second frequency divider 26 output local oscillation signals LO/I and LO/Q in the VHF band, having a phase difference of 90°.

On the other hand, when a UHF signal is to be received, the third switching circuit 27 connects the second frequency divider 26 to the oscillator 22, so that an oscillation signal between 946 MHz to 1,210 MHz, output from the oscillator 22, is divided by two by the second frequency divider 26 to 473 MHz to 605 MHz with a duty ratio of 50%, and the master F/F circuit 26am and the slave F/F circuit 26as of the second frequency divider 26 output local oscillation signals LO/I and LO/Q in the UHF band, having a phase difference of 90°.

Figure 6:
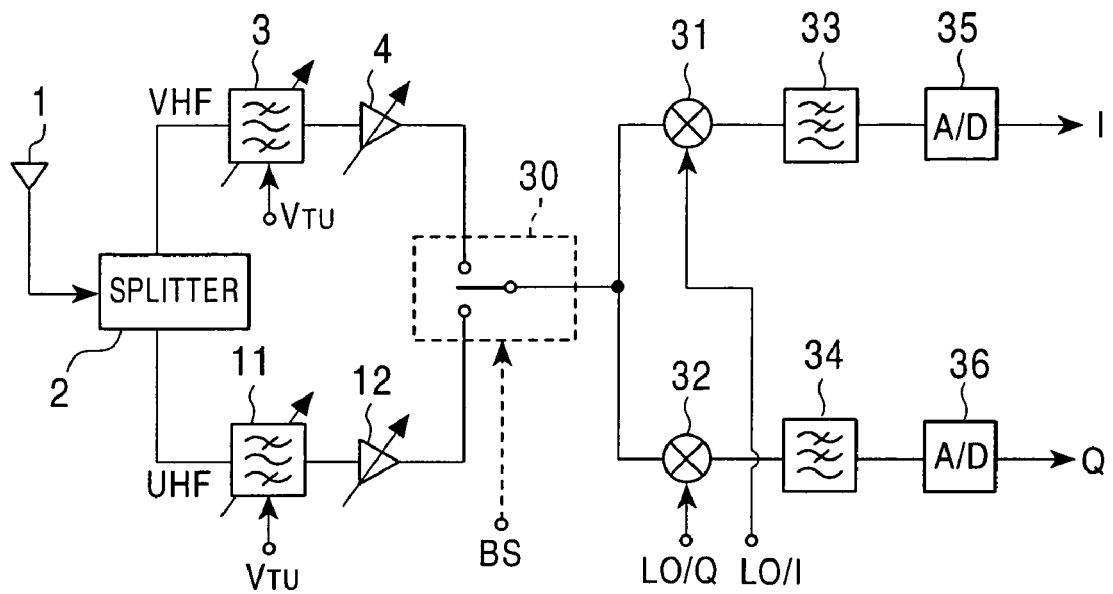
FIG. 6 is a circuit diagram showing the construction of a direct conversion tuner according to another embodiment of the present invention.
Figure 7:
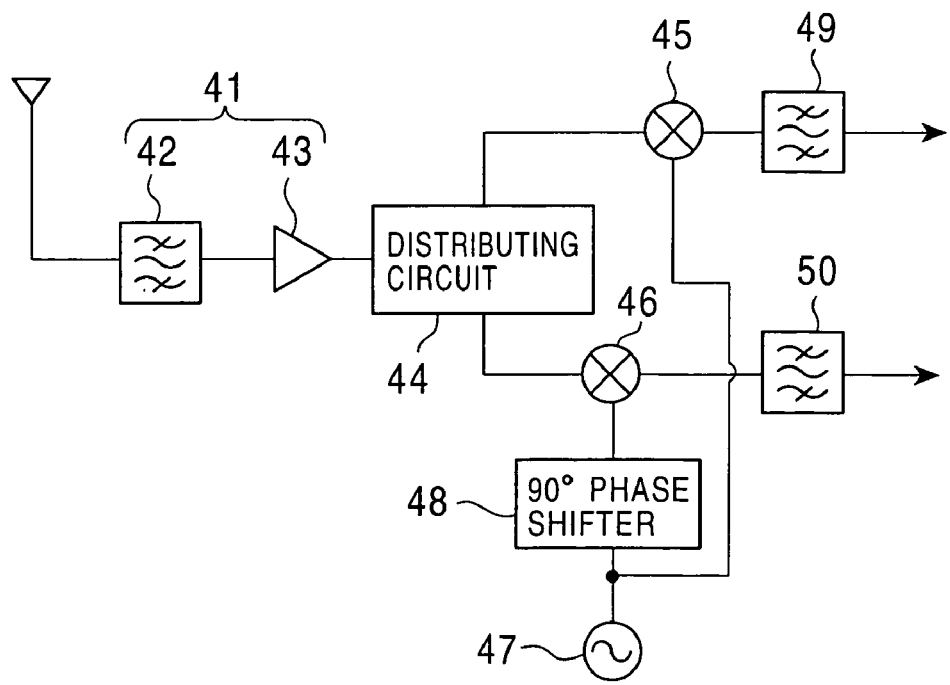
FIG. 7 is a circuit diagram showing the construction of a conventional direct conversion tuner.

FIG. 6 is a circuit diagram showing the construction of a direct conversion tuner according to another embodiment of the present invention. Referring to FIG. 6, as opposed to FIG. 1, stages subsequent to the VHF amplifier 4 and the UHF amplifier 12 are implemented as a single line. More specifically, at a stage next to the VHF amplifier 4 and the UHF amplifier 12, a fourth switching circuit 30 for switching between a VHF signal and a UHF signal is provided. The fourth switching circuit 30 is switched according to a band switching signal BS. The fourth switching circuit 30 is connected to two mixers 31 and 32 that directly convert a VHF signal or a UHF signal into an I signal and a Q signal. These two mixers 31 and 32 respectively receive local oscillation signals LO/I and LO/Q in the VHF band or the UHF band from the local oscillation unit 21.

At a subsequent stage of one mixer 31, an IF bandpass filter 33 and an A/D converter 35 are connected in series. Similarly, the other mixer 32 is connected in series with an IF bandpass filter 34 and an A/D converter 36. Thus, the A/D converters 35 and 36 output an I signal and a Q signal based on a V/RF signal or an I signal and a Q signal based on a U/RF signal according to switching of the fourth switching circuit 30.

What is claimed is:
1. A direct conversion tuner comprising;
   mixers that orthogonally convert a VHF signal located in high channels of the VHF band and a UHF signal located in a frequency range of 470 MHz to 608 MHz in the UHF band directly into baseband signals;
   an oscillator that supplies local oscillation signals to the mixers,
   a first frequency divider that divides the oscillation signal having the sixfold frequency by three and that outputs a divided-frequency signal having a duty ratio of 50%: and
   a second frequency divider that performs divide-by-two frequency division and that outputs two divided-frequency signals having a phase difference of 90°,
   wherein the oscillator is caused to oscillate at a frequency that is sixfold a frequency in the high channels of the

VHF band or a frequency that is twofold a frequency in the frequency range of 470 MHz to 608 MHz in the UHF band, wherein an oscillation signal having the twofold frequency is divided by two and an oscillation signal having the sixfold frequency is divided by six to generate local oscillation signals having orthogonal phases for both of these oscillation signals, and wherein the local oscillation signals having the divided frequencies are supplied to the mixers, and wherein the divided-frequency signal of the first frequency divider or the oscillation signal having the twofold frequency is input to the second frequency divider; and, the first frequency divider is formed by first and second master-slave flip-flop circuits connected in series with each other and a logic OR circuit connected to an output of a master flip-flop circuit and an output of a slave flip-flop circuit in the first or second master-slave flip-flop circuit, and the second frequency divider is formed b a Johnson-counter 90° phase shifter including a third master-slave flip-flop circuit.

2. The direct conversion tuner according to claim 1, further comprising a splitter that separates the VHF signal in the VHF band and the UHF signal in the UHF band, wherein the mixers are connected to one output terminal and the other output terminal of the splitter, respectively.

3. The direct conversion tuner according to claim 1, further comprising a splitter that separates the VHF signal in the VHF band and the UHF signal in the UHF band, and a switching circuit connected at a subsequent stage of the splitter, wherein the mixers are connected to the switching circuit.

4. The direct conversion tuner according to claim 1, wherein at least one of the VHF signal or the UHF signal is a digital television signal.

* * * * *

UNITED STATES PATENT AND TRADEMARK OFFICE
CERTIFICATE OF CORRECTION

PATENT NO. : 7,280,163 B2 Page 1 of 1
APPLICATION NO. : 10/909472
DATED : October 9, 2007
INVENTOR(S) : Takeo Suzuki et al.

It is certified that error appears in the above-identified patent and that said Letters Patent is hereby corrected as shown below:

<u>In the Claims</u>

Column 8, in claim 1, line 1, after "divider is formed" delete "b" and substitute --by-- in its place.

Signed and Sealed this

Sixth Day of May, 2008

JON W. DUDAS
*Director of the United States Patent and Trademark Office*